(12) United States Patent
Kugiyama

(10) Patent No.: US 10,483,424 B2
(45) Date of Patent: Nov. 19, 2019

(54) SIGNAL COUPLING DEVICE

(71) Applicant: KABUSHIKI KAISHA TOSHIBA, Tokyo (JP)

(72) Inventor: Yuta Kugiyama, Buzen Fukuoka (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/837,907

(22) Filed: Aug. 27, 2015

(65) Prior Publication Data
US 2016/0260862 A1    Sep. 8, 2016

(30) Foreign Application Priority Data
Mar. 2, 2015  (JP) .................................. 2015-040633

(51) Int. Cl.
*H01L 31/12* (2006.01)
*H01L 31/0203* (2014.01)
(Continued)

(52) U.S. Cl.
CPC .......... *H01L 31/125* (2013.01); *H01L 25/167* (2013.01); *H01L 31/0203* (2013.01);
(Continued)

(58) Field of Classification Search
CPC ..... H01L 31/125; H01L 25/167; H01L 33/52; H01L 33/56; H01L 31/0203
See application file for complete search history.

(56) References Cited

U.S. PATENT DOCUMENTS

| 4,636,636 A * | 1/1987 | McMahon | ............... G01D 5/26 250/227.11 |
| 5,049,527 A * | 9/1991 | Merrick | ............... H01L 31/167 174/529 |

(Continued)

FOREIGN PATENT DOCUMENTS

| JP | S59200442 A | 11/1984 |
| JP | H02103254 A | 4/1990 |

(Continued)

OTHER PUBLICATIONS

Korean Office Action dated Feb. 17, 2017, filed in Korean counterpart Application No. 10-2015-0142072, 12 pages (with translation).

(Continued)

*Primary Examiner* — Xinning (Tom) Niu
*Assistant Examiner* — Sean P Hagan
(74) *Attorney, Agent, or Firm* — Kim & Stewart LLP

(57) ABSTRACT

A signal coupling device includes a light-emitting element configured to emit light, a first element to drive the light-emitting element to output an optical signal, and a second element to receive the optical signal from the light-emitting element and to convert the optical signal into an electrical signal. A first silicone gel covers the first semiconductor element. A second silicone gel covers the second semiconductor element. A third silicone gel covers the light-emitting element. The light-emitting element, the first semiconductor element, and the second semiconductor element are encapsulated in resin material, which contacts the first, second, and third silicone gels. The first silicone gel, the second silicone gel, the third silicone gel, and the first resin material, and the resin material are transparent to light emitted by the light-emitting element. The first, second, and third silicone gels are spaced apart from each other.

20 Claims, 7 Drawing Sheets

(51) Int. Cl.
  *H01L 33/52* (2010.01)
  *H01L 33/56* (2010.01)
  *H01L 25/16* (2006.01)
  *H01L 31/167* (2006.01)

(52) U.S. Cl.
  CPC ............ *H01L 31/167* (2013.01); *H01L 33/52* (2013.01); *H01L 33/56* (2013.01); *H01 2924/181* (2013.01)

(56) References Cited

U.S. PATENT DOCUMENTS

| | | | |
|---|---|---|---|
| 5,150,438 | A | 9/1992 | Brown |
| 6,507,035 | B1* | 1/2003 | Hasegawa ............ H01L 31/167 250/551 |
| 6,712,529 | B2 | 3/2004 | Horio |
| 7,476,890 | B2 | 1/2009 | Kishi |
| 2002/0122308 | A1* | 9/2002 | Ikeda ................... H01S 5/0427 362/259 |
| 2002/0190262 | A1* | 12/2002 | Nitta ................... H01L 25/0753 257/99 |
| 2005/0040421 | A1* | 2/2005 | Wu ....................... H01L 25/167 257/99 |
| 2006/0054901 | A1* | 3/2006 | Shoji ..................... H01L 21/565 257/80 |
| 2007/0075886 | A1* | 4/2007 | Sakura ................. H04B 14/026 341/143 |
| 2007/0090307 | A1 | 4/2007 | Kishi |
| 2007/0112147 | A1* | 5/2007 | Morita ................... C08L 83/04 525/478 |
| 2007/0187629 | A1* | 8/2007 | Matsuyama ............ H01L 31/14 250/551 |
| 2008/0023711 | A1* | 1/2008 | Tarsa .................... H01L 33/486 257/98 |
| 2009/0065792 | A1 | 3/2009 | Thompson et al. |
| 2009/0174048 | A1* | 7/2009 | Liu ................... H01L 23/49575 257/676 |
| 2014/0027807 | A1* | 1/2014 | Tasaki ..................... H01L 33/58 257/98 |

FOREIGN PATENT DOCUMENTS

| | | |
|---|---|---|
| JP | H05-003339 A | 1/1993 |
| JP | H05-315474 A | 11/1993 |
| JP | H06151951 A | 5/1994 |
| JP | H0626845 | 7/1994 |
| JP | H0856012 A | 2/1996 |
| JP | H10321897 A | 12/1998 |
| JP | H11-004016 A | 1/1999 |
| JP | H1154789 A | 2/1999 |
| JP | H11150291 A | 6/1999 |
| JP | H11-233810 A | 8/1999 |
| JP | 2002176184 A | 6/2002 |
| JP | 2004140220 A | 5/2004 |
| JP | 2004343059 A | 12/2004 |
| JP | 2005093495 A | 4/2005 |
| JP | 2007115908 A | 5/2007 |
| JP | 2008-085154 A | 4/2008 |
| JP | 2010226343 A | 10/2010 |

OTHER PUBLICATIONS

Taiwan Office Action dated Dec. 27, 2016, filed in Taiwan counterpart Application No. 104136064. 6 pages (with translation).
Japanese Office Action dated Oct. 31, 2017, filed in Japanese counterpart Application No. 2015-040633, 11 pages (with translation).
Chinese Office Action dated Feb. 24, 2018, filed in Chinese counterpart Application No. 201510489230.3, 20 pages (with translation).

* cited by examiner

1

1(2)

1(2)

1(2)

1(2)

SIGNAL COUPLING DEVICE

CROSS-REFERENCE TO RELATED APPLICATION

This application is based upon and claims the benefit of priority from Japanese Patent Application No. 2015-040633, filed Mar. 2, 2015, the entire contents of which are incorporated herein by reference.

FIELD

Embodiments described herein relate generally to a signal coupling device such as, for example, an optical coupling device.

BACKGROUND

An optical coupling device generates or receives an optical signal corresponding to a voltage (or current) signal from a transmission chip. The voltage (or current) signal is used for driving light-emission of a light-emitting element, and the optical signal thus generated is subsequently received by a reception chip. The reception chip converts the optical signal into a voltage (or a current) signal. Optical coupling devices are often used as a circuit for driving a semiconductor element, such as an insulated-gate bipolar transistor (IGBT), that is used for electric power operations. In some applications, an insulating signal coupling device using capacitive coupling or magnetic coupling may be used instead of an optical coupling device.

The optical coupling device can be an integrated circuit (IC) including the transmission chip, the light-emitting element, and the reception chip in one package.

The signal coupling devices may be used under various operating and/or environmental conditions, and thus it is desired for circuit characteristics such as a gain not to vary with changes in operating or environmental conditions.

DETAILED DESCRIPTION

Figure 1:
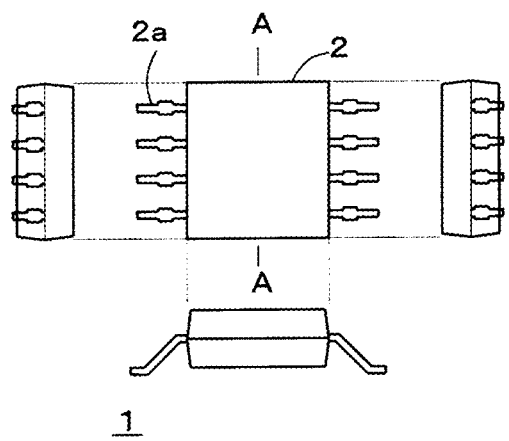
FIG. 1 is an external appearance view of an IC package of an optical coupling device.

According to a first example embodiment, a signal coupling device includes a light-emitting element disposed on a first frame portion and configured to emit light, a first semiconductor element disposed on a second frame portion and configured to drive the light-emitting element to output an optical signal, and a second semiconductor element disposed on a third frame portion and configured to receive the optical signal from the light-emitting element and to convert the optical signal into an electrical signal. A first silicone gel is disposed on the second frame portion and covers the first semiconductor element. A second silicone gel is disposed on the third frame portion and covers the second semiconductor element. A third silicone gel is disposed on the first frame portion and covers the light-emitting element. A first resin material encapsulates the light-emitting element, the first semiconductor element, and the second semiconductor element. The first resin material is in contact with the first, second, and third silicone gels. In some embodiments, each of the first silicone gel, the second silicone gel, the third silicone gel, and the first resin material are transparent to a wavelength of light emitted by the light-emitting element. In some embodiments, the first, second, and third silicone gels do not contact each other— that is, they are spaced apart from each other.

In general, according to a second exemplary embodiment, a signal coupling device includes a light-emitting element that emits an optical signal, a first semiconductor element that drives the light-emitting element to generate the optical signal, a second semiconductor element that receives the optical signal to convert the optical signal into an electrical signal, a first silicone material of a gel type that covers a side surface and a top surface of the first semiconductor element, a second silicone material that is disposed with being spaced away from the first silicone material, and covers a side surface and a top surface of the second semiconductor element, a third silicone material that is disposed with being spaced away from the first and second silicone materials, and covers a side surface and a top surface of the light-emitting element that faces the second semiconductor element, a first resin material that covers peripheries of the first silicone material, the second silicone material, and the third silicone material, a second resin material that covers periphery of the first resin material. The first to third silicone materials, and the first resin material are transparent with respect to a wavelength of the optical signal emitted from the light-emitting element, and the second resin material is opaque with respect to the wavelength of the optical signal emitted from the light-emitting element.

Hereinafter, exemplary embodiments will be described with reference to the accompanying drawings. In the following exemplary embodiments, although description will be mainly given based on specific configurations and operations in an optical coupling device and an insulating device, the optical coupling device and the insulating device may have configurational and/or operational feature variations which are not explicitly mentioned in the following description, which focuses on the differences in the embodiments. Those configurations and operations variations which are not explicitly mentioned yet apparent to those of ordinary skill in the art are also included in the exemplary embodiments.

Figure 2:
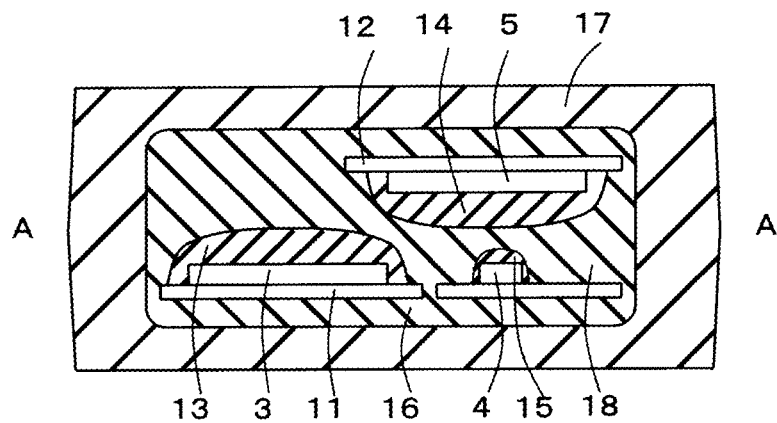
FIG. 2 is a cross-sectional view taken along line A-A in FIG. 1.

FIG. 1 shows external views of an IC package 2 for an optical coupling device 1, and FIG. 2 is a cross-sectional view taken along line A-A in FIG. 1. As illustrated in FIG.

2, the optical coupling device 1 in FIG. 1 includes a transmission chip 3, a light-emitting element 4, and a reception chip 5.

For example, as illustrated in FIG. 1, the IC package 2 includes two groups of four terminals 2a disposed respectively along each of two opposite sides of the IC package 2. The four terminals 2a on one side are connected to the transmission chip 3, and the four terminals 2a on the other side are connected to the reception chip 5. In the following description, each of the terminals 2a which are connected to the transmission chip 3 is referred to as a terminal for a transmission chip, and each of the terminals 2a which are connected to the reception chip 5 is referred to as a terminal for a reception chip.

A shape of the IC package 2, the number of the terminals 2a, and disposition of the terminal 2a are illustrative only, and embodiments may vary the shape of the IC package 2 (e.g., the overhead planar shape is not limited to rectangular), the number of terminals 2a may be varied (e.g., not limited to eight total terminals, and may be more or less than eight), the positioning of the terminals 2a on IC package 2 may be varied, and the number of terminals 2a connected to reception chip 5 may be, but is not required to be, equal to the number of terminals 2a connected to the transmission chip 3. FIG. 1 is exemplary and there is no limitation of possible embodiments to the specific embodiment depicted in FIG. 1. For example, the IC package 2 according to this exemplary embodiment may be a surface mounting type such as SOP (small outline package), or may be an insertion mounting type such as DIP (dual in-line package). In addition, a multi-channel configuration is also possible.

As illustrated in FIG. 2, a first frame 11 on which a transmission chip (first semiconductor element) 3 and a light-emitting element (second semiconductor element) 4 are mounted, and a second frame 12 on which a reception chip 5 is mounted are disposed to face each other inside of the IC package 2. More specifically, the light-emitting element 4 and a light-receiving element of the reception chip 5 are disposed to face each other. The transmission chip 3 and the terminal for a transmission chip are connected to each other by a bonding wire (not specifically illustrated), and the transmission chip 3 and the light-emitting element 4 are connected to each other by a bonding wire (not specifically illustrated). Similarly, the reception chip 5 and the terminal for a reception chip are connected to each other by a bonding wire (not specifically illustrated).

In addition, a symmetric structure, which is rotated by 180° about the center of the IC package 2 with the transmission chip 3 and the reception chip 5 set to face each other, is also possible. In addition, in FIG. 2, an example of mounting one transmission chip 3, one light-emitting element 4, and one reception chip 5 in the IC package 2 is illustrated, but a plurality of chips of the above-described elements may be respectively mounted to achieve a multi-channel configuration. In this case, it is preferable to maintain a relative positional relationship between the transmission chips 3 and the reception chips 5.

In addition, first to third encapsulating resins (first to third silicone materials) 13 to 15, an inner resin (first resin material) 16, and an outer resin (second resin material) 17 are provided at the inside of the IC package 2.

The first encapsulating resin 13 covers a side surface and a top surface of the transmission chip 3. The second encapsulating resin 14 covers a side surface and a top surface of the reception chip 5. The third encapsulating resin 15 covers a side surface and a top surface of the light-emitting element 4. The inner resin 16 covers the periphery of the first to third encapsulating resins 13 to 15, and the first and second frames 11 and 12. The outer resin 17 covers the periphery of the inner resin 16. In addition, the encapsulating resins 13 to 15 may cover only the top surface of the respective chips. The outer resin 17 is a material that exists on an outer surface of the IC package 2. The first to third encapsulating resins 13 to 15 and the inner resin 16 are transparent resins, and more specifically, resin materials transparent with respect to a wavelength of an optical signal emitted from the light-emitting element 4. The outer resin 17 is a resin material opaque with respect to the wavelength of the optical signal emitted from the light-emitting element 4. In addition, the outer resin 17 also shields external light so that the external light does not enter the transmission chip 3, the light-emitting element 4, and the reception chip 5. For example, the color of the outer resin 17 is black or white.

A transmittance of the encapsulating resins 13 to 15 with respect to wavelength bands of the optical signal is 90% or greater. On the other hand, particulates of $SiO_2$ or the like are added to the inner resin 16 to obtain a linear expansion coefficient that matches the outer resin 17 as much as possible. Accordingly, a transmittance of the inner resin 16 with respect to the wavelength bands of the optical signal is at least substantially 40% or greater. The transmittance also depends on the thickness of a resin, and thus an absorption coefficient is 700 $m^{-1}$ or less.

As described above, the IC package 2 in FIG. 2 has a double-mold structure in which an outer surface of the inner resin 16 is covered with the outer resin 17.

The first to third encapsulating resins 13 to 15 are disposed to be spaced from each other, and the inner resin 16 is disposed between the encapsulating resins 13 to 15 in a close contact manner. On a propagation path of the optical signal emitted from the light-emitting element 4, the third encapsulating resin 15 that covers the light-emitting element 4, the inner resin 16, and the second encapsulating resin 14 that covers the reception chip 5 are present. The resins 14, 15, and 16 are at least partially transparent, and thus the optical signal is received by the reception chip 5 in a designed range without a substantial loss.

The first to third encapsulating resins 13 to 15 are formed of a silicone gel that is softer than silicone rubber. The inner resin 16 is formed of, for example, an epoxy resin or a harden silicone rubber in which transparent filler or the like is mixed, and the outer resin 17 is formed of an epoxy resin in which fine carbon (e.g., carbon black), titanium dioxide ($TiO_2$), or the like is mixed.

Figure 3:
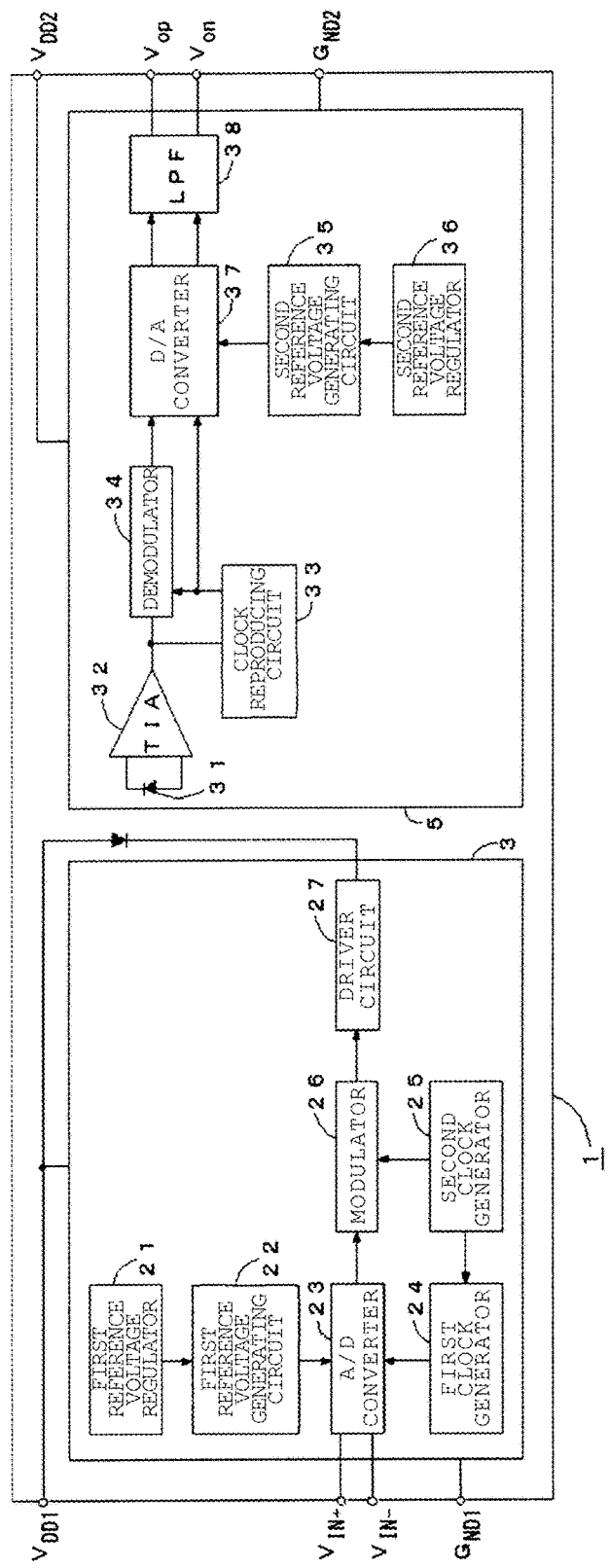
FIG. 3 is a block diagram illustrating an inner configuration of a transmission chip and a reception chip.

FIG. 3 is a block diagram illustrating an inner configuration of the transmission chip 3 and the reception chip 5. The transmission chip 3 in FIG. 3 includes a first reference voltage regulator 21, a first reference voltage generating circuit 22, an A/D converter 23, a first clock generator 24, a second clock generator 25, a modulator 26, and a driver circuit 27.

The first reference voltage generating circuit 22 generates a first reference voltage that is used by the A/D converter 23. The first reference voltage generating circuit 22 includes a band-gap circuit and a buffer circuit, which are not specifically illustrated. The buffer circuit buffers the first reference voltage that is generated by the band-gap circuit. The first reference voltage regulator 21 adjusts (regulates) a voltage level of the first reference voltage that is generated by the first reference voltage generating circuit 22.

The A/D converter 23 converts a voltage signal input to the transmission chip 3 into a digital signal by using the first reference voltage in synchronization with a first clock signal that is generated by the first clock generator 24 or, alternatively, a first clock signal that is input from the outside. For example, the A/D converter 23 performs A/D conversion through ΔΣ (delta-sigma) modulation, but may use other A/D conversion methods.

The modulator 26 generates a modulation signal (for example, a pulse-width-modulation (PWM) signal) based on the digital signal that is generated by the A/D converter 23 in synchronization with a second clock signal that is generated by the second clock generator 25. The driver circuit 27 controls a cathode voltage of the light-emitting element 4 based on the modulation signal (for example, the PWM signal). A power supply voltage is supplied to an anode of the light-emitting element 4. Accordingly, a voltage between the anode and the cathode of the light-emitting element 4 varies in accordance with the modulation signal (for example, a pulse width of the PWM signal), and the light-emitting element 4 emits an optical signal in accordance with the modulation signal (for example, the PWM signal). For example, the light-emitting element 4 is an LED, and emits an optical signal with intensity in accordance with the voltage between the anode and the cathode.

The reception chip 5 includes a photo-diode 31, a transimpedance amplifier (TIA) 32, a clock reproducing circuit 33, a demodulator (for example, a PWM demodulator) 34, a second reference voltage generating circuit 35, a second reference voltage regulator 36, a D/A converter 37, and a low-pass filter (LPF) 38.

The photo-diode 31 receives the optical signal that is emitted from the light-emitting element 4, and converts the optical signal into a current signal. The transimpedance amplifier 32 converts the current signal, which flows through the photo-diode 31, into a voltage signal. The demodulator (for example, the PWM demodulator) 34 demodulates the voltage signal that is generated by the transimpedance amplifier 32 into an original modulation signal (for example, a PWM modulation signal). The D/A converter 37 converts the demodulation signal that is demodulated by the demodulator (for example, the PWM demodulator) 34 into an analog voltage signal. The low-pass filter 38 outputs an analog voltage signal after removing a low-frequency noise included in the voltage signal that is generated by the D/A converter 37. As is the case with the first reference voltage generating circuit 22, the second reference voltage generating circuit 35 includes a band-gap circuit and a buffer circuit. In addition, in a case of a digital output, the D/A converter 37 and the low-pass filter 38 can be stopped or bypassed, and a digital signal of the clock reproducing circuit 33 and the demodulator (for example, the PWM demodulator) 34 can be directly output.

In the optical coupling devices according to the related art, even in a case of covering the reception chip 5 or the light-emitting element 4 with an encapsulating member, the transmission chip 3 is not covered with the encapsulating member. The reason for this is as follows. The light-emitting element 4 and the reception chip 5 transmit and receive an optical signal to and from each other, and are required to be protected for prevention of adherence of dust and the like, or for prevention of deterioration of the light-emitting element 4 due to a stress from the inner resin 16. However, the transmission chip 3 does not have such a concern, and thus it is considered that the transmission chip 3 may be directly covered with the inner resin 16 or the outer resin 17. In addition, in the related art, as a material of an encapsulating member, a material such as a silicone rubber with high hardness is used so as to prevent the encapsulating resin from being deformed during molding of the inner resin 16 or the outer resin 17.

In a case where the IC package of the optical coupling device according to the related art has a double-mold structure, in general, the reception chip and the light-emitting element are covered with an encapsulating member formed of a silicone resin of a rubber type with high hardness, and after covering the periphery of the encapsulating member and the transmission chip with a transparent resin material, the periphery is further covered with a black resin material.

Figure 4:
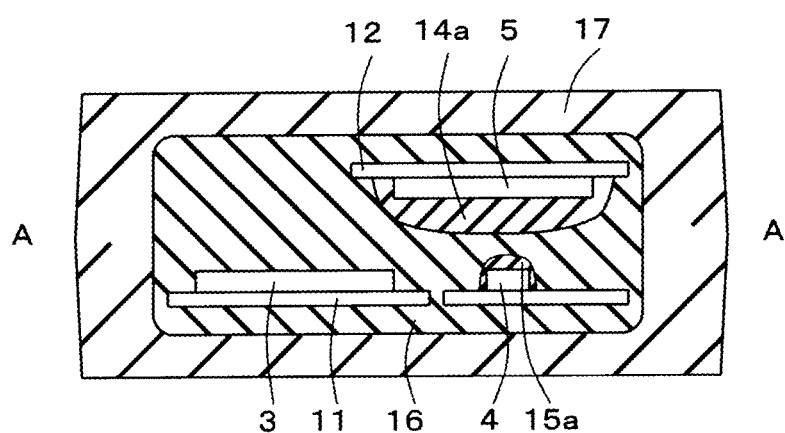
FIG. 4 is a cross-sectional view of the IC package of an optical coupling device according to a comparative example.

FIG. 4 is a cross-sectional view of an IC package 2 of an optical coupling device 1 according to a comparative example. The cross-sectional direction in FIG. 4 is the same as in FIG. 2. The IC package 2 in FIG. 4 has a double-mold structure, the transmission chip 3 is not covered with an encapsulating member, and the reception chip 5 and the light-emitting element 4 are covered with encapsulating resins 14a and 15a formed of a silicone rubber. The inner resin 16 is an epoxy resin or a silicone resin of a rubber-type, and the outer resin 17 is an epoxy resin.

A high-temperature saturated water vapor pressure test called a "pressure cooker test" (PCT) was performed on the optical coupling device 1 according to the comparative example in FIG. 4 for 96 hours. From the PCT test, it may be seen that a gain that is an output voltage with respect to an input voltage of the optical coupling device 1 according to the comparative example in FIG. 4 varies. The PCT is an accelerated life test that is performed to evaluate temperature resistance and humidity resistance of an IC. As the cause of variation in the gain, various causes are considered. A signal level is most likely to vary in an operational amplifier that is used in the first and second reference voltage generating circuits 22 and 35 among circuits that configure the optical coupling device 1. Although the first and second reference voltage generating circuits 22 and 35 have a band-gap circuit, an output signal of the band-gap circuit is subjected to negative feedback control by the operational amplifier. When forming the operational amplifier as an integrated circuit, a CMOS circuit is used. However, a differential MOS transistor pair at an input stage of the operational amplifier is particularly susceptible to a variation in environmental conditions, and thus electrical characteristics thereof tend to vary.

It is known that a channel mobility of the MOS transistors varies in accordance with a stress. When the IC in FIG. 1 is placed in the high-temperature and high-humidity atmosphere (e.g., undergoes PCT), volume expansion occurs in resins inside the IC package 2, and when a compressive stress due to this volume expansion is applied to the transmission chip 3 and the reception chip 5 during device operation, the electrical characteristics of the differential MOS transistor pair in the operational amplifier unevenly varies. Accordingly, there is a concern that an off-set voltage may occur in the operational amplifier. When the off-set voltage occurs in the operational amplifier, a voltage level of a reference voltage varies, and thus a level of a signal that is output from the transmission chip 3 or the reception chip 5 varies. As a result, it is considered that the gain of the optical coupling device 1 also varies.

As described above, the first or second reference voltage generating circuit 22 or 35, which include an operational amplifier, is included in the transmission chip 3 and the reception chip 5, and thus a variation in the reference voltage due to stress tends to occur in both of the chips. In addition, when a difference occurs between stresses applied to the respective chips (chip 3 and chip 5), an amount of variation in the reference voltage is not uniform and may be different in each case. Accordingly, when operated under severe conditions for a long period of time, there is a concern that a gain variation of the optical coupling device 1 increases.

In addition, an operational amplifier, which is used in the first and second reference voltage generating circuits 22 and 35, is also used for control other than the negative feedback control of the band-gap circuit. The reference voltage that is generated by a band-gap circuit is input to a buffer circuit, but an operational amplifier is also used in the buffer circuit.

As described above, the first or second reference voltage generating circuit 22 or 35 may include a plurality of the operational amplifiers. If the off-set voltage varies in accordance with applied stresses on the various operational amplifier occurs, an amount of variation in each off-set voltage will generally not be uniform, and a relative balance between these various operational amplifiers collapses, it may thus be considered that the gain of the optical coupling device 1 greatly varies under long-term operating conditions.

From experimental results it has been found that when the transmission chip 3 and the reception chip 5 are covered with an encapsulating member formed of a silicone gel, it is possible to mitigate a stress. The silicone gel has a hardness value less than that of an epoxy resin or a silicone rubber, and thus the silicone gel is a material that tends to plastically deform more easily than these other materials. The hardness value of the silicone gel may be measured, for example, by a durometer. For the silicone gel that is used in this example embodiment, the hardness value, which is measured by the durometer in accordance with Japanese Industrial Standards (JIS) K 6253 or JIS K 7215 (Type A), is in a range of 10 to 24, for example, 16 to 24. An experiment was carried out varying the hardness value of the applied silicone gel material. From experiment, it may be seen that if the hardness value is less than 10, the shape of the silicone gel tends to collapse (deform), and thus there is a concern that it is difficult to stably maintain an intended external shape of the first to third encapsulating resins 13 to 15 when such material is used. In addition, it may be seen that if the hardness value is 16 or greater, it is possible to form a more stable shape. In addition, it may be seen that if the hardness value exceeds 24, the adhesiveness between such a gel and the inner resin 16 may deteriorate, and a gap between the materials may form. If the gap occurs, there is a concern that peeling-off may occur or an insulation withstand voltage performance may deteriorate, and thus the presence of a gap is not preferable. In addition, the interface between the materials (the encapsulating resin and the inner resin) may include a peeled-off portion and a still-adhered or a still-in-contact portion; however, the state of the interface will vary with time (e.g., additional portions may peel off and/or peeled-off portions may be brought back into contact) under long-term operating conditions and thus device characteristics may vary with time in an unpredictable manner. At an interface between different resin materials, amounts of deformation can be different between a longitudinal direction and a lateral direction, the amount of deformation is generally greater in the longitudinal direction, and the amount of deformation is generally less in the lateral direction. Accordingly, there is a tendency for expansion of the encapsulating resin to most obviously occur at the apex portion (in a vertical direction) of the resin body, and for shrinkage of the encapsulating resin to most obviously occur at a peripheral portion (in a horizontal direction).

For reference, hardness value of the inner resin 16, as measured by a durometer (in accordance with the same above-listed standards), is 75. When the hardness of a silicone resin of a gel type is in a range of 10 to 24, the adhesiveness between the first to third encapsulating resins 13 to 15 and the inner resin 16 (having hardness approximately 75) is generally satisfactory, and peeling-off does not occur before or after the accelerated life testing, such as PCT, and interfacial peeling is not found at the apex portion or the peripheral portion of the encapsulating resins 13 to 15. As described above, it is preferable that the hardness value of the inner resin 16 be three or more times the hardness value of the first to third encapsulating resins 13 to 15.

If the transmission chip 3, the reception chip 5, and the light-emitting element 4 are covered with the silicone gel with a hardness value of 10 to 24, and preferably 16 to 24, even when carrying out the accelerated life test (such as PCT) under the high-temperature and high-humidity, it is possible to mitigate stresses which affect the transmission chip 3 and the reception chip 5, and thus it is possible to suppress the variation in gain, which is exhibited as an output voltage/an input voltage of the optical coupling device 1, to a certain extent with no problem in practical use.

In the related art, as illustrated in the comparative example of FIG. 4, in a case of double-molding an isolation IC, the reception chip 5 and the light-emitting element 4 are covered with encapsulating resins 14a and 15a which are formed of a relatively hard (i.e., greater hardness than the silicone gel type materials used as encapsulating resins 13 to 15) resin material such as a silicone rubber. And with respect to the transmission chip 3, an encapsulating member is not formed and the inner resin 16 is formed directly contacting the side and upper surfaces of the transmission chip 3. The outer resin 17 is formed in a similar manner as is depicted in FIG. 2. The adhesiveness between the inner resin 16 and the encapsulating resins 14a and 15a deteriorates, and thus interfacial peeling-off tends to occur particularly near a side surface portion of the reception chip 5. On the other hand, on an upper surface side of the reception chip 5, the encapsulating resins 14a and 15a and the inner resin 16 are strongly bonded to each other. Accordingly, when the accelerated life test is performed, a stress tends to be applied to the upper surface side of the reception chip 5, which tends to cause variation in gain to occur. In addition, the side surface and the top surface of the transmission chip 3 is directly covered with the inner resin 16, and the inner resin 16 is also a hard material, and thus there is a concern that a stress may also be applied to the transmission chip 3. Additionally, the amount of deformation of the resin at the periphery of the reception chip 5 and the transmission chip 3 is not uniform before and after long-term operation, and thus there is a possibility that operational balance of components may be lost.

In contrast, in the embodiment depicted in FIG. 2, both of the transmission chip 3 and the reception chip 5 are covered with the first and second encapsulating resins 13 and 14, both of which are formed of a soft silicone gel (hardness range 10 to 24). Accordingly, the stress may be dispersed in this silicone gel type material, and thus even when performing PCT under high-temperature and high-humidity conditions, it is possible to reduce the stress that is applied to the transmission chip 3 and the reception chip 5 while maintaining operational balance between component. In addition, stress is not strongly applied to a part of the surface of the transmission chip 3 and the reception chip 5 because the first to third encapsulating resins 13 to 15 are formed of the silicone gel type material, and thus adhesiveness with the inner resin 16 is also satisfactory, and partial peeling-off does not occur.

As demonstrated by experiment, even when using the silicone gel as described above, if the thickness of the first and second encapsulating resins 13 and 14 are altered, it may be seen that the gain variation amount will still greatly vary. That is, it is necessary to select an appropriate thickness for the first and second encapsulating resins 13 and 14 formed of silicone gel type material.

Figure 5:
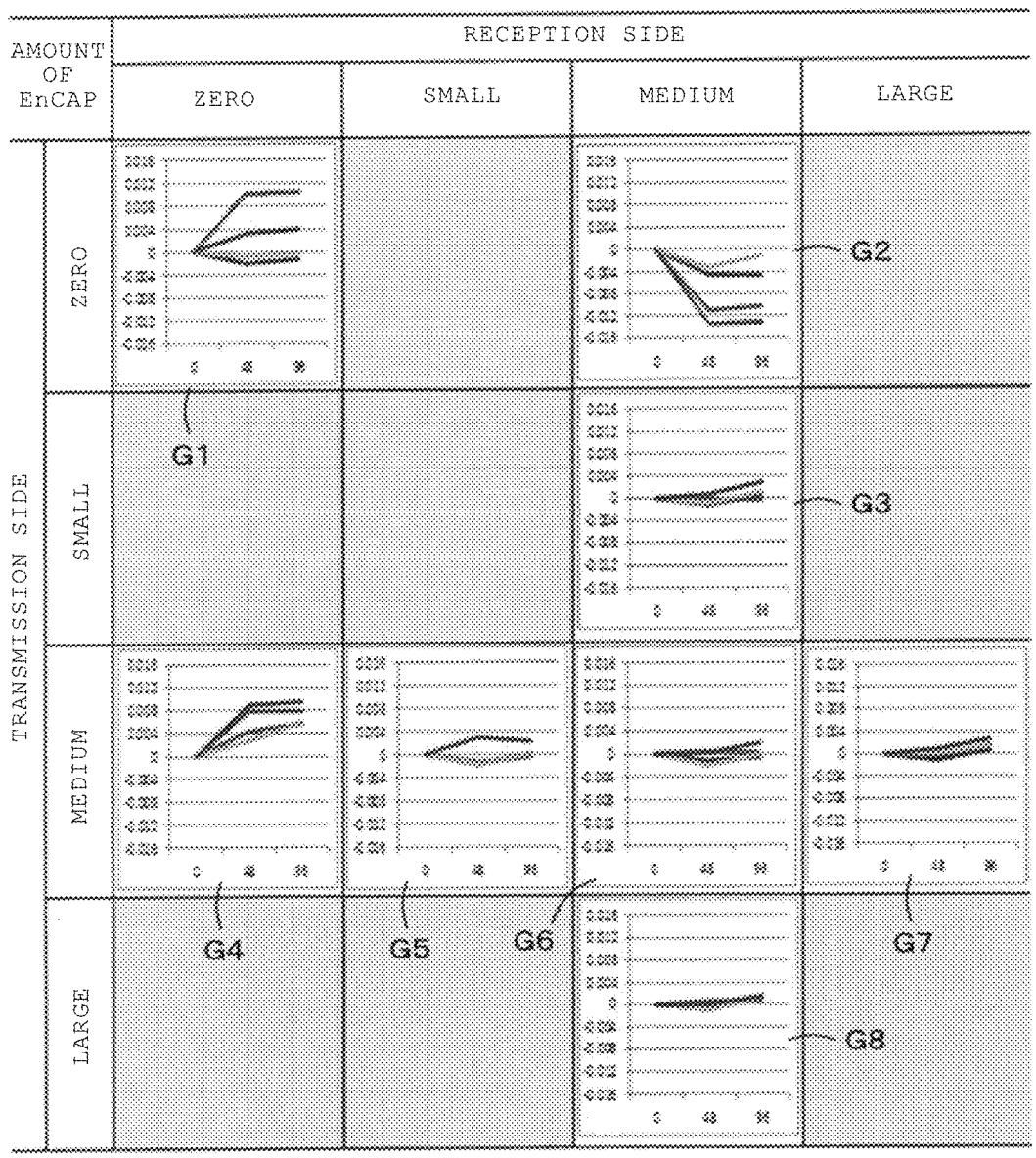
FIG. 5 is a graph illustrating a relationship between the thickness of first and second encapsulating resins and a gain variation amount.

FIG. 5 is a graph illustrating measured gain variation amount during PCT for different thicknesses for first encapsulating resin 13 and second encapsulating resin 14. In FIG. 5 each graph (G1-G8) illustrates measurement results of the gain variation amount with the passage of time for four optical coupling devices 1 (hereinafter, referred to as a specimen) for eight different cases including cases where at least one of the first and second encapsulating resins 13 and 14 is not present (i.e., zero thickness) (see G1, G2, G4), a case where the first encapsulating resin 13 has a small thickness (120 µm to 170 µm) (see G3), cases where the first encapsulating resin 13 has a medium thickness (170 µm to 220 µm) (see G4, G5, G6, G7, and a case where the first thickness is great (220 µm to 270 µm). In respective graphs, the horizontal axis represents a test time during the PCT, and the vertical axis represents the gain variation amount. A graph G1 represents a case where the transmission chip 3 and the reception chip 5 are not covered with the first and second encapsulating resins 13 and 14, a graph G2 represents a case where only the reception chip 5 is covered with the second encapsulating resin 14, a graph G3 represents a case where the thickness of the first encapsulating resin 13 is small, and the thickness of the second encapsulating resin 14 is medium, a graph G4 to a graph G7 represent a case where the thickness of the first encapsulating resin 13 is medium, and the thickness of the second encapsulating resin 14 is zero, small, medium, and large, and a graph G8 represents a case where the thickness of the first encapsulating resin 13 is great, and the thickness of the second encapsulating resin 14 is medium. The four lines in the graphs G1 to G8 represent measurement results of four specimens in each test.

As may be seen from the graphs G1 to G8, if the thickness of the first and second encapsulating resins 13 and 14 is medium or greater, the gain variation amount is less. In addition, it may be seen that the greater the thickness of the first and second encapsulating resins 13 and 14, the greater the effect in reducing the gain variation amount is.

Figure 6:
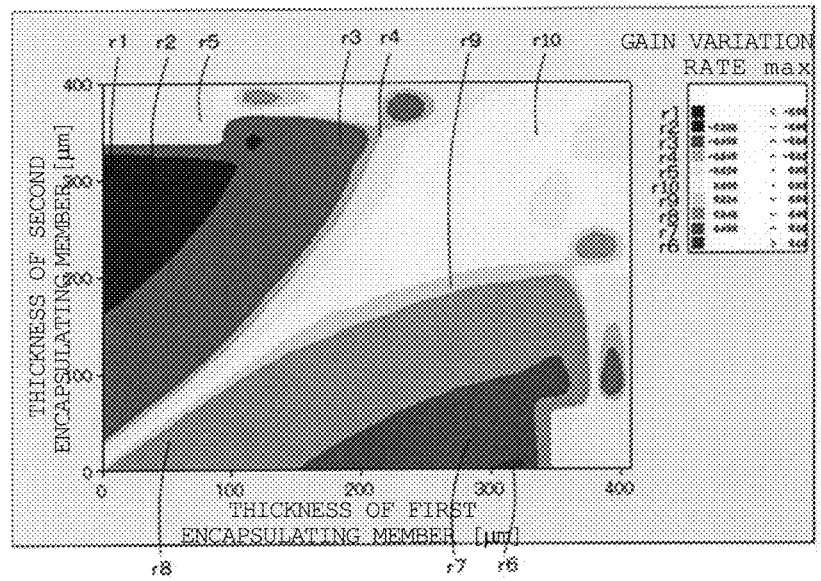
FIG. 6 is a graph illustrating a relationship between the thickness of the first and second encapsulating resins and a gain variation rate.

FIG. 6 is a diagram illustrating a gain variation rate with respect to the thickness of the first encapsulating resin 13 and the second encapsulating resin 14 (a gain variate after 96 h/an initial value). In FIG. 6, the horizontal axis represents the thickness of the first encapsulating resin 13, and the vertical axis represents the thickness of the second encapsulating resin 14.

In FIG. 6, a region r1 represents a region in which a ratio of the thickness of the second encapsulating resin 14 to the thickness of the first encapsulating resin 13 is significantly large, a region r2 represents a region in which the above-described ratio is large next to the region r1, a region r3 is a region in which the above-described ratio is large next to the region r2, a region r4 is a region in which the above-described ratio is large next to the region r3, and a region r5 is a region in which the above-described ratio is large next to the region r4. In addition, a region r6 is a region in which the ratio of the thickness of first encapsulating resin 13 to the thickness of the second encapsulating resin 14 is significantly large, a region r7 is a region in which the above-described ratio is large next to the region r6, a region r8 is a region in which the above-described ratio is large next to the region r7, a region r9 is a region in which the above-described ratio is large next to the region r8, and a region r10 is a region in which the above-described ratio is large next to the region r9.

In the regions r1 to r5, a gain variation rate toward a negative direction increases. Here, the negative direction represents that a gain becomes smaller than the original gain. Particularly, in the regions r1 and r2 (the thickness of the second encapsulating resin 14 is 180 µm or greater, and the thickness of the first encapsulating resin 13 is 100 µm or less), the negative gain variation rate further increases.

On the other hand, the regions r6 to r9 are regions in which the thickness of the first encapsulating resin 13 is greater than the thickness of the second encapsulating resin 14, and in these regions r6 and r9, the gain variation rate toward a positive direction increases. Here, the positive direction represents that a gain becomes larger than the original gain. Particularly, in the regions r6 and r7 (the thickness of the first encapsulating resin 13 is 180 µm or greater, and the thickness of the second encapsulating resin 14 is 100 µm or less), the positive gain variation rate further increases. In a region r10 between the regions r1 to r4 and the regions r6 to r9, the gain variation rate is the smallest. The region r10 is a region in which the thickness of a first encapsulating member and the thickness of a second encapsulating member are substantially the same. In addition, if the thickness of the first encapsulating member and the thickness of the second encapsulating member are 200 µm or greater, it may be seen that even when a difference occurs in the thickness of both of the encapsulating members, the variation amount is small.

Figure 7:
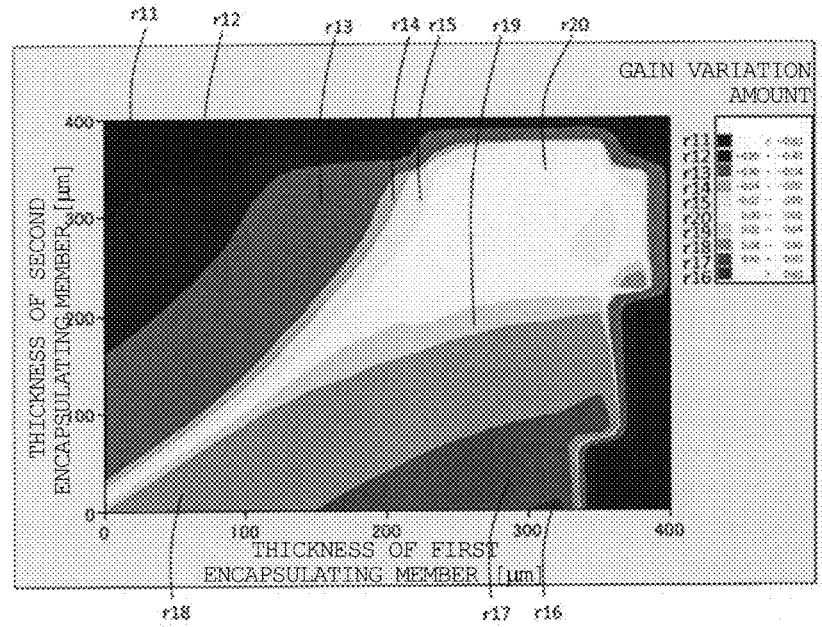
FIG. 7 is a graph illustrating a relationship between the thickness of the first and second encapsulating resins and the gain variation amount.

FIG. 7 is a diagram illustrating a gain variation amount (a difference between a gain value after 96 h and an initial gain value) with respect to the thickness of the first encapsulating resin 13 and the second encapsulating resin 14. In FIG. 7, the horizontal axis represents the thickness of the first encapsulating resin 13, and the vertical axis represents the thickness of the second encapsulating resin 14.

In FIG. 7, a region r11 represents a region in which a ratio of the thickness of the second encapsulating resin 14 to the thickness of the first encapsulating resin 13 is significantly large, a region r12 is a region in which the above-described ratio is large next to the region r11, a region r13 is a region in which the above-described ratio is large next to the region r12, a region r14 is a region in which the above-described ratio is large next to the region r13, and a region r15 is a region in which the above-described ratio is large next to the region r14. In addition, a region r16 is a region in which a ratio of the thickness of the first encapsulating resin 13 to the thickness of the second encapsulating resin 14 is significantly large, a region r17 is a region in which the above-described ratio is large next to the region r16, a region r18 is a region in which the above-described ratio is large next to the region r17, a region r19 is a region in which the above-described ratio is large next to the region r18, and a region r20 is a region in which the above-described ratio is large next to the region r19.

In the regions r11 to r15, the gain variation amount toward the negative direction increases, and in the regions r16 to r19, the gain variation amount toward the positive direction increases. In the region r20 between the regions r11 to r15, and the regions r16 to r19, the gain variation amount is the smallest. The region r20 is a region in which the thickness of the first encapsulating member and the thickness of the second encapsulating member are substantially the same. In addition, if the thickness of the first encapsulating member and the thickness of the second encapsulating member are 200 µm or greater, it may be seen that even when a difference occurs in the thickness of both of the encapsulating members, the variation amount is small.

That is, as may be seen from the diagrams in FIGS. 6 and 7, it is preferable that the thickness of the first and second encapsulating member are made to be equal to each other, and are set as approximately 100 μm to 250 μm. In addition, when the thickness on one side is 200 μm or greater, it is preferable to set the thickness of the first and second encapsulating members greater than 200 μm.

As described above, in the case of the double-mold structure, a great difference occurs in the thickness of the first encapsulating resin 13 and the second encapsulating resin 14, a difference also occurs in the stress which is applied to the transmission chip 3 and the reception chip 5, and thus the gain variation amount increases. Accordingly, it is preferable that the first encapsulating resin 13 and the second encapsulating resin 14 are set to have substantially the same thickness. As will be described later, it is necessary to change the thickness of the first and second encapsulating resins 13 and 14 due to the thickness or the area of the transmission chip 3 or the reception chip 5, and the like. Accordingly, more specifically, it is preferable to optimize the thickness of the first and second encapsulating resins 13 and 14 such that a stress applied to the transmission chip 3 and a stress applied to the reception chip 5 are substantially equal to each other, and stress values decrease.

In addition, from FIG. 7, it may be seen that as the thickness of the first and second encapsulating resins 13 and 14 increases, a region in which the gain variation amount decreases exists.

When referring to FIG. 7, it may be seen that the lower limit of the thickness of the first and second encapsulating resins 13 and 14 is 100 μm or greater, preferably 200 μm or greater, and more preferably 250 μm or greater.

In addition, the upper limit of the thickness of the first and second encapsulating resins 13 and 14 is set to satisfy a condition in which the first encapsulating resin 13, the second encapsulating resin 14, and the third encapsulating resin 15 that covers the side surface and the top surface of the light-emitting element 4 do not come into contact with each other. The reason for this is because if the first to third encapsulating resins 13 to 15 come into contact with each other, there is a concern that insulation withstand voltage may decrease.

In addition, in the international safety standard (VDE: Verband Deutsher Electrotechnisher) of a photo-coupler and the like, a withstand voltage of 3.75 kV is required at a space insulation distance of 0.4 mm between the transmission chip 3 and the reception chip 5. According to the standard, it is necessary to secure an insulation distance of 0.2 mm in respective conductive regions including a wire on a transmission chip 3 side and a wire on a reception chip 5 side. That is, it is necessary for the space insulation distance to be 0.4 mm or greater. A bonding wire is connected to the top surface of the transmission chip 3 and the reception chip 5, and the thickness of the bonding wire is approximately 100 μm to 200 μm. With regard to the space insulation distance that is the closest separation distance between respective conductive portions on a transmission chip 3 side and on a reception chip 5 side, it is necessary to secure 0.4 mm in a connection state with the bonding wire. Accordingly, so as to achieve the thinnest package, it is necessary to suppress the upper limit of the thickness of the first and second encapsulating resins 13 and 14, which are adjacent to or intersect each other, to 300 μm to 400 μm.

In summary, as may be seen from the graphs in FIGS. 5 and 6, the lower limit of the thickness of the first and second encapsulating resins 13 and 14 is 100 μm or greater, preferably 200 μm or greater, and more preferably 250 μm or greater.

In addition, the upper limit of the thickness of the first and second encapsulating resins 13 and 14 is set to satisfy a condition in which the first to third encapsulating resins 13 to 15 do not come into contact with each other, and the upper limit is specifically 300 μm to 400 μm in consideration of the international safety standard.

In addition, the thickness of the first and second encapsulating resins 13 and 14 may be set to the maximum thickness in the vicinity of the central portion of the transmission chip 3 or the reception chip 5 when considering that the thickness in the vicinity of the central portion of each of the chips 3 and 5 is greater than the thickness of an edge portion. More preferably, the upper limit is an average thickness on a surface of the transmission chip 3 or the reception chip 5.

In addition, even in a symmetric structure which is rotated by 180° about the center of the package 2 with the transmission chip 3 and the reception chip 5 set to face each other, it is possible to obtain satisfactory results. On the other hand, if one of the transmission chip 3 and the reception chip 5 greatly deviates from a relative position, there is a concern that the gain variation rate before deviation may be shifted to the region r2 or r7, and the like from the region r10 in FIG. 6 after deviation. Accordingly, it is necessary for a relative position of the transmission chip 3 and the reception chip 5 to be restricted from the center of symmetry within at least 15% of a dimension of a long side of the chips. The reason for the restriction is because a permissible thickness in the variation rate in FIG. 6 is 30 μm, and the minimum value in a thickness necessary for coating is 100 μm. As is the case with a multi-channel structure and the like, if a plurality of chips are mounted, with regard to a pair of transmission chip 3 and reception chip 5 between which a signal is exchanged, it is also necessary for the relative position thereof to be restricted within 15% of a dimension of a long side of the chips.

However, it is considered that the larger the thickness of the transmission chip 3 and the reception chip 5 is, the higher the resistance against a stress becomes. Accordingly, as the thickness of the transmission chip 3 and the reception chip 5 increases, the thickness of the first and second encapsulating resins 13 and 14, which is necessary for mitigation of the stress, may be decreased. It has been seen that the thickness of the first and second encapsulating resins 13 and 14, and the thickness of the transmission chip 3 and the reception chip 5 have a substantially inversely proportional relationship. For example, if the thickness of the transmission chip 3 or the reception chip 5 is set as t1, and an inversely proportional coefficient is set as k1, the lower limit of the thickness of the first or second encapsulating resin 13 or 14, which is necessary for mitigation of a stress, is equal to or greater than a range of k1×100/t1 to k1×250/t1. Similarly, the upper limit of the thickness of the first or second encapsulating resin 13 or 14, which is required for mitigation of a stress, is equal to or less than a range of k1×300/t1 to k1×400/t1.

Similarly, it is considered that the greater the thickness of the IC package 2 of the optical coupling device 1 is, the higher the resistance against a stress becomes. Accordingly, as the thickness of the IC package 2 increases, the thickness of the first and second encapsulating resins 13 and 14, which is necessary for mitigation of the stress, may be decreased. It has been seen that the thickness of the first and second encapsulating resins 13 and 14 and the thickness of the IC package 2 have the substantially inversely proportional relationship. For example, if the thickness of the IC package 2 is set as t2, and an inversely proportional coefficient is set as k2, the lower limit of the thickness of the first or second encapsulating resin 13 or 14, which is required for mitigation of a stress, is equal to or greater than a range of k2×100/t2 to k2×250/t2. Similarly, the upper limit of the thickness of the first or second encapsulating resin 13 or 14, which is required for mitigation of a stress, is equal to or less than a range of k2×300/t2 to k2×400/t2.

In addition, it has been seen that the stress applied to the transmission chip 3 and the reception chip 5 also depends on the surface area of the transmission chip 3 and the reception chip 5. The larger the surface area is, the more stress that tends to be applied. It has been seen that the surface area and the stress of the transmission chip 3 and the reception chip 5 have the substantially proportional relationship. For example, if the surface area of the transmission chip 3 or the reception chip 5 is set as t3, and a proportional coefficient is set as k3, the lower limit of the thickness of the first or second encapsulating resin 13 or 14, which is required for mitigation of the stress, is equal to or greater than a range of k3×100×t3 to k3×250×t3. Similarly, the upper limit of the thickness of the first or second encapsulating resin 13 or 14, which is required for mitigation of the stress, is equal to or less than a range of k3×300×t3 to k3×400×t3.

As illustrated in FIG. 2, not only the transmission chip 3 and the reception chip 5 are covered with the first and the second encapsulating resins 13 and 14, but also the side surface and/or the top surface of the light-emitting element 4 is covered with the third encapsulating resin 15. It is considered that the optical signal that is emitted from the light-emitting element 4 is not affected by stress, and thus the third encapsulating resin 15 is not requisite from the viewpoint of stress mitigation. However, as is the case with the first and second encapsulating resins 13 and 14, it is preferable that the light-emitting element 4 is covered with the third encapsulating resin 15 formed of a silicone gel in consideration of protection of the light-emitting element 4, adhesiveness with the inner resin 16, and the like. The reason for the preference is as follows. If a gap occurs at the periphery of the light-emitting element 4 due to a variation with the passage of time, reflection of light occurs in accordance with the gap. As a result, an amount of light varies in the reception chip 5, and deterioration is caused due to an increase in defects inside an element or propagation of the defects when peeling-off and partial-stress-concentration close contact occur.

As described above, in the first embodiment, in the optical coupling device 1 having the double-mold structure, the transmission chip 3 and the reception chip 5 are covered with the first and second encapsulating resins 13 and 14, each being formed of the silicone gel, and thus even when performing the accelerated life test such as the PCT in a high-temperature and high-humidity atmosphere, the stress applied to the transmission chip 3 or the reception chip 5 is mitigated with the silicone gel and becomes more uniform. Accordingly, it is possible to suppress a gain variation of the optical coupling device 1. In addition, the thickness of the first and second encapsulating resins 13 and 14 is optimized, and thus it is possible to minimize the gain variation of the optical coupling device 1.

Second Embodiment

Figure 8:
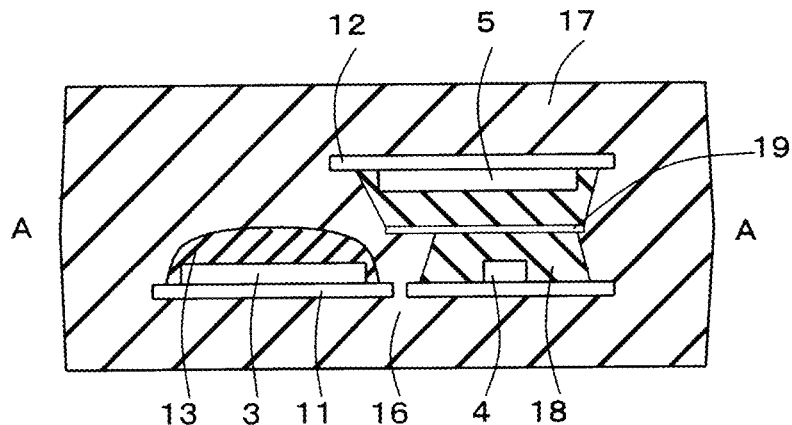
FIG. 8 is a cross-sectional view of an IC package of an optical coupling device according to a second embodiment.
Figure 9:
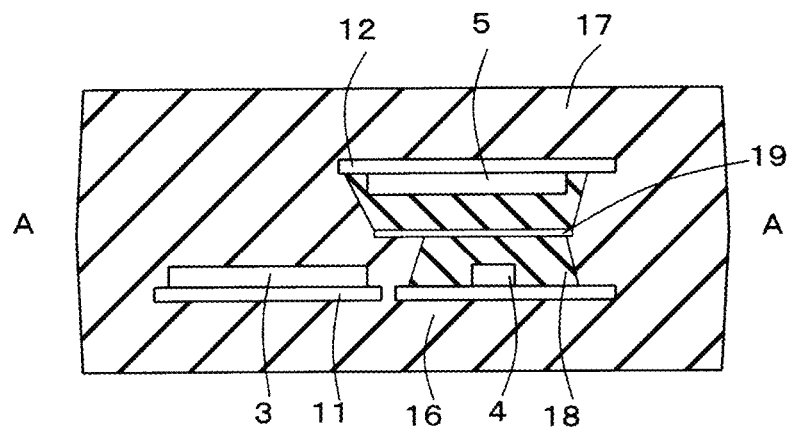
FIG. 9 is a cross-sectional view of an IC package according to a comparative embodiment.

FIG. 8 is a cross-sectional view of an IC package 2 of an optical coupling device 1 according to a second embodiment, and FIG. 9 is a cross-sectional view of an IC package 2 according to a comparative example. The IC package 2 in FIGS. 8 and 9 has a single mold structure.

As is the case with the first embodiment, in the IC package 2 in FIG. 8, the transmission chip 3 is covered with the first encapsulating resin 13 formed of silicone gel. In addition, in the IC package 2 in FIG. 8, the side surface and the top surface of the light-emitting element 4, the side surface and the top surface of the reception chip 5, and an optical path from the light-emitting element 4 to the light-receiving element 5 are covered with a silicone rubber 18 that is harder than silicone gel. In addition, a film 19 (insulating film) is disposed at an intermediate position between the silicone rubber portions adjacent to light-emitting element 4 and the reception chip 5, and the silicone rubber is thus divided into two parts by the film 19. The periphery of the silicone rubber 18 and the first encapsulating resin 13 is covered with the outer resin 17.

The film 19 is intended to prevent device short-circuiting from occurring during the accelerated life test such as PCT in the high-temperature and high-humidity atmosphere due to a gap that might form between the silicone rubber and the outer resin 17. In addition, in some embodiments, encapsulation may be carried out with the silicone gel instead of the silicone rubber to further raise the insulation withstand voltage—that is, element 18 can be a silicone gel material similar to the first encapsulating resin 13.

In the comparative example illustrated in FIG. 9, the transmission chip 3 is not covered with the first encapsulating resin 13, and comes into direct contact with the outer resin 17.

In the case of the comparative example in FIG. 9, the outer resin 17 is harder than the silicone gel or the silicone rubber, and thus the outer resin 17 does not serve to mitigate stresses applied to the transmission chip 3, and a reference voltage in the transmission chip 3 may thus vary. As a result, there is a concern that gain variation in the optical coupling device 1 may occur.

In contrast, in the IC package 2 illustrated in FIG. 8, the transmission chip 3 is covered with the first encapsulating resin 13 formed of the silicone gel or the silicone rubber as in the first embodiment. Accordingly, even in long-term and severe conditions such as in-vehicle use, it is possible to mitigate stresses with the silicone gel or the silicone rubber, and thus it is possible to suppress the gain variation of the optical coupling device 1.

When referring to FIG. 6, it may be seen that if the thickness of the first encapsulating resin 13 exceeds approximately 200 µm, it is possible to suppress the gain variation without depending on the thickness of a first encapsulating member on a reception chip 5 side. From FIG. 6, it may be seen that if the thickness of the first encapsulating resin 13 is 200 µm, the gain variation slightly depends on the thickness of the encapsulating member on the reception chip 5 side, but if the thickness exceeds 250 µm, the gain variation does not mostly depend on the thickness of the encapsulating member on the reception chip 5 side. Accordingly, it is desirable to set the thickness of the first encapsulating resin 13, which covers the transmission chip 3 in the single mold structure, to 200 µm or greater, and more preferably 250 µm or greater.

In addition, the upper limit of the thickness of the first encapsulating resin 13 is set in a range satisfying a condition in which the first encapsulating resin 13 does not come into contact with the silicone rubber or the silicone rubber on an adjacent reception side (e.g., the portion of material 18 adjacent to reception chip 5).

As described above, even in the case of configuring the IC package 2 of the optical coupling device 1 with a single mold, if the transmission chip 3 is covered with the first encapsulating resin 13 formed of the silicone gel or the silicone rubber similar to the first embodiment, it is possible to mitigate stresses applied to the transmission chip 3, and thus it is possible to suppress the gain variation of the optical coupling device 1.

Third Embodiment

In the above-described first and second embodiment, description is given of the optical coupling device in which transmission and reception of the optical signal from the light-emitting element 4 are carried out with the optical signal transmitting and optical signal receiving elements being electrically isolated/insulated from each other, but other insulating signal coupling devices may also transmit a signal in a contactless manner, for example, through magnetic coupling or capacitive coupling.

In a case of carrying out signal transmission through the magnetic coupling, for example, a coil on a transmission chip side and a coil on a reception chip side may be disposed to be magnetically coupled. Alternatively, a resistance bridge circuit may be provided on the reception chip side in combination with provision of the coil on the transmission chip side.

In addition, in a case of carrying out signal transmission through the capacitive coupling, for example, a capacitor may be provided between the transmission chip and the reception chip, an electrode on one side of the capacitor may be connected to the transmission chip, and an electrode on the other side may be connected to the reception chip.

Even in the insulating signal coupling devices that carries out the signal transmission through the magnetic coupling or the capacitive coupling, a reference voltage generating circuit is provided in the transmission chip and the reception chip, and thus the reference voltage that is generated by this reference voltage generating circuit varies due to stress applied to the transmission chip or the reception chip. Accordingly, as described in the first and second embodiments, it is desirable to cover the transmission chip and/or the reception chip with encapsulating resin formed of silicone gel so as to mitigate the stress.

Figure 10A:
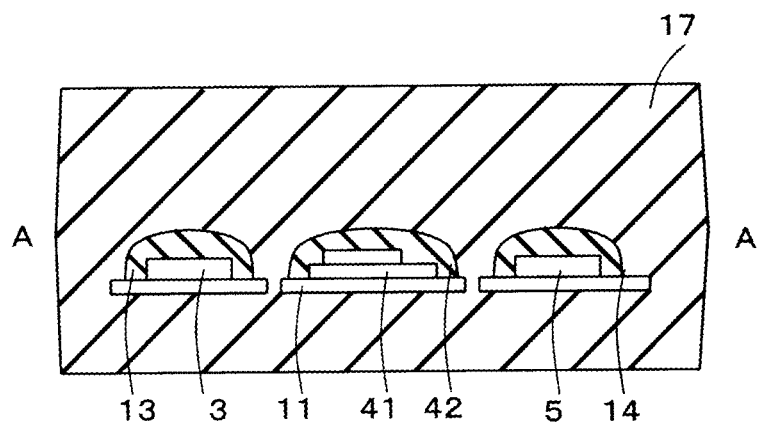
FIG. 10A is a cross-sectional view of a signal coupling device using a magnetic coupling or capacitive coupling.
Figure 10B:
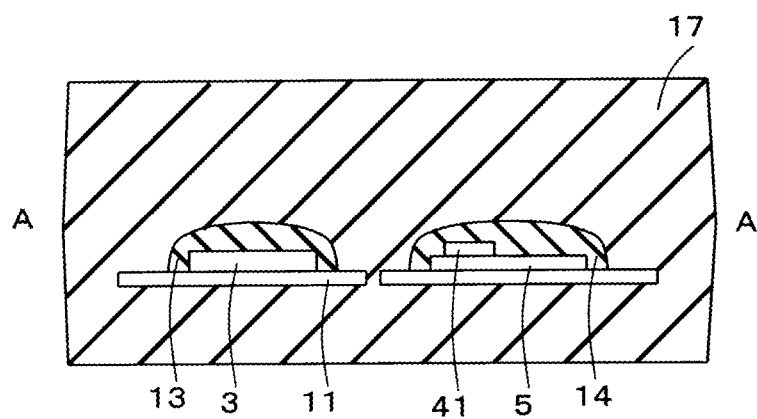
FIG. 10B is a cross-sectional view of the signal coupling device using the magnetic coupling or the capacitive coupling.

FIGS. 10A and 10B are cross-sectional views of insulating signal coupling devices using magnetic coupling or capacitive coupling. In the case of FIG. 10A, the transmission chip 3 and the reception chip 4 are insulated from each other, and a stacked body 41 of passive elements such as an insulated coil and a capacitor are disposed on the frame 11. Each of the transmission chip 3, the reception chip 4, and the stacked body 41 are separately covered with encapsulating resins 13, 14, and 42, respectively, which are formed of silicone gel or silicone rubber as discussed in conjunction with the first embodiment.

In FIG. 10B, the transmission chip 3 and the reception chip 4 are insulated from each other and disposed on a frame 11, and the stacked body 41 including passive elements, such as the insulated coil and the capacitor, is integrated with the reception chip 4. As described in the first and second embodiments, the side surface and the top surface of the transmission chip 3 and the reception chip 4 are covered with an encapsulating resin (13 and 14, respectively) formed of silicone gel or silicone rubber.

FIGS. 10A and 10B illustrate a single mold structure, and thus it is preferable that the thickness of the encapsulating resin 13 which covers the transmission chip 3, and the encapsulating resin 14 which covers the reception chip 4, are set to a thickness of 200 μm or greater, as similar to the second embodiment. In addition, with regard to the encapsulating resins (13 and 14, respectively) that cover the transmission chip 3 and the reception chip 4, the thickness thereof is desirable to be substantially the same at each position.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal coupling device, comprising:
a light-emitting element disposed on a first frame portion and configured to emit light;
a first semiconductor element disposed on a second frame portion and having an operational amplifier with a CMOS circuit, the first semiconductor element being configured to drive the light-emitting element to output an optical signal, the first semiconductor element including a first reference voltage generating circuit configured to generate a first reference voltage, the first semiconductor element including an analog-to-digital converter configured to convert a voltage signal into a digital signal based on the first reference voltage and a modulator configured to generate a modulation signal synchronized with the optical signal based on the digital signal;
a second semiconductor element disposed on a third frame portion and configured to receive the optical signal from the light-emitting element and to convert the optical signal into an electrical signal, the second semiconductor element including a second reference voltage generating circuit configured to generate a second reference voltage, the second semiconductor element including a photoelectric converter, the photoelectric converter configured to convert the optical signal to the electrical signal, a demodulator configured to demodulate the electrical signal, and a digital-to-analog converter configured to convert the electrical signal into an analog voltage signal based on the second reference voltage;
a first silicone gel disposed on the second frame portion and covering the first semiconductor element;
a second silicone gel disposed on the third frame portion and covering the second semiconductor element;
a third silicone gel disposed on the first frame portion and covering the light-emitting element; and
a first resin material encapsulating the light-emitting element, the first semiconductor element, and the second semiconductor element and contacting the first, second, and third silicone gels, wherein
the first silicone gel suppresses variations in the first reference voltage.

2. The signal coupling device according to claim 1, wherein
the first silicone gel, the second silicone gel, the third silicone gel, and the first resin material are transparent to a wavelength of light emitted by the light-emitting element, and the first, second, and third silicone gels are spaced apart from each other.

3. The signal coupling device according to claim 1, further comprising:
a second resin material encapsulating the first resin material, wherein
the second resin material is substantially opaque with respect to a wavelength of light emitted by the light-emitting element,
and the first resin material is transparent to the wavelength.

4. The signal coupling device according to claim 1, wherein the first silicone gel has a hardness value as determined in accordance with at least one of Japanese Industrial Standard K 6253 and Japanese Industrial Standard K 7215 that is in a range from 10 to 24.

5. The signal coupling device according to claim 4, wherein the second silicone gel has a hardness value as determined in accordance with at least one of Japanese Industrial Standard K 6253 and Japanese Industrial Standard K 7215 that is in a range from 10 to 24.

6. The signal coupling device according to claim 5, wherein the third silicone gel has a hardness value as determined in accordance with at least one of Japanese Industrial Standard K 6253 and Japanese Industrial Standard K 7215 that is in a range from 10 to 24.

7. The signal coupling device according to claim 4, wherein a hardness value of the first resin material as determined in accordance with at least one of Japanese Industrial Standard K 6253 and Japanese Industrial Standard K 7215 that is greater than the hardness value of the first silicone gel by at least a factor of three.

8. The signal coupling device according to claim 1, wherein the first silicone gel has a hardness value as determined in accordance with at least one of Japanese Industrial Standard K 6253 and Japanese Industrial Standard K 7215 that is in a range of 16 to 24.

9. The signal coupling device according to claim 1, wherein the first, second, and third silicone gels are a same material.

10. The signal coupling device according to claim 1, wherein an average thickness of the first silicone gel on a surface of the first semiconductor element facing away from the second frame portion and an average thickness of the second silicone gel on a surface of the second semiconductor element facing away from the third frame portion are each greater than or equal to 100 μm and less than or equal to 400 μm.

11. The signal coupling device according to claim 1, further comprising:
an insulating film disposed between the light-emitting element and the second semiconductor element in an optical path from the light-emitting element and the second semiconductor element, the second silicone gel contacting a first surface of the insulating film, the third silicone gel contacting a second surface of the insulating film opposite the first surface.

12. A signal coupling device, comprising:
a light-emitting element disposed on a first frame portion and configured to emit light;
a first semiconductor element disposed on a second frame portion and having and operation amplifier with a CMOS circuit, the first semiconductor element being configured to drive the light-emitting element to output an optical signal, the first semiconductor element including a first reference voltage generating circuit configured to generate a first reference voltage, the first semiconductor element including an analog-to-digital converter configured to convert a voltage signal into a digital signal based on the first reference voltage and a modulator configured to generate a modulation signal synchronized with the optical signal based on the digital signal;
a second semiconductor element disposed on a third frame portion and configured to receive the optical signal from the light-emitting element and to convert the optical signal into an electrical signal, the second semiconductor element including a second reference voltage generating circuit configured to generate a second reference voltage, the second semiconductor element including a photoelectric converter, the photoelectric converter configured to convert the optical signal to the electrical signal, a demodulator configured to demodulate the electrical signal, and a digital-to-analog converter configured to convert the electrical signal into an analog voltage signal based on the second reference voltage;
a first silicone material disposed on the second frame portion and covering the first semiconductor element, the first silicone material being a gel;
a second silicone material disposed on the third frame portion and covering the second semiconductor element, the second silicone material being one of a gel and a rubber;
a third silicone material disposed on the first frame and covering the light emitting element, the third silicone material being one of a gel and a rubber; and
a first resin material encapsulating the light-emitting element, the first semiconductor element, and the second semiconductor element and contacting the first, second, third silicone materials, wherein
the first silicone material suppresses variations in the first reference voltage.

13. The signal coupling device according to claim 12, wherein
the second and third silicone materials are transparent at a wavelength of light emitted by the light-emitting element, and
the first silicone material is spaced apart from the second and third silicone materials.

14. The signal coupling device according to claim 12, further comprising:
an insulating film disposed between the light-emitting element and the second semiconductor element in an optical path from the light-emitting element and the second semiconductor element, the second silicone material contacting a first surface of the insulating film, the third silicone material contacting a second surface of the insulating film opposite the first surface.

15. The signal coupling device according to claim 14, wherein the first resin material is opaque with respect to the wavelength of light emitted by the light-emitting element.

16. The signal coupling device according to claim 14, wherein the second and third silicone materials are silicone rubbers.

17. The signal coupling device according to claim 12, wherein the first silicone material has a hardness value as determined in accordance with at least one of Japanese Industrial Standard K 6253 and Japanese Industrial Standard K 7215 that is in a range from 10 to 24.

18. The signal coupling device according to claim 12, wherein an average thickness of the first silicone material on a surface of the first semiconductor element facing away from the second frame portion is greater than or equal to 200 μm.

19. The signal coupling device according to claim 1, wherein
   the second silicone gel suppresses variations of the second reference voltage.

20. The signal coupling device according to claim 12, wherein
   the second silicone material suppresses variations of the second reference voltage.

\* \* \* \* \*